United States Patent
Chiu et al.

(10) Patent No.: US 9,490,394 B2
(45) Date of Patent: Nov. 8, 2016

(54) SEMICONDUCTOR LIGHT-EMITTING DEVICE

(71) Applicant: EPISTAR CORPORATION, Hsinchu (TW)

(72) Inventors: Hsin-Chih Chiu, Hsinchu (TW); Shih-I Chen, Hsinchu (TW); Chih-Chiang Lu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/996,744

(22) Filed: Jan. 15, 2016

(65) Prior Publication Data

US 2016/0211412 A1 Jul. 21, 2016

(30) Foreign Application Priority Data

Jan. 16, 2015 (TW) .............................. 104101418 A

(51) Int. Cl.
| | |
|---|---|
| *H01L 33/00* | (2010.01) |
| *H01L 33/22* | (2010.01) |
| *H01L 33/38* | (2010.01) |
| *H01L 33/40* | (2010.01) |
| *H01L 33/42* | (2010.01) |
| *H01L 33/30* | (2010.01) |
| *H01L 33/50* | (2010.01) |

(52) U.S. Cl.
CPC .............. *H01L 33/22* (2013.01); *H01L 33/30* (2013.01); *H01L 33/38* (2013.01); *H01L 33/405* (2013.01); *H01L 33/42* (2013.01); *H01L 33/505* (2013.01)

(58) Field of Classification Search
CPC ...... H01L 33/505; H01L 33/38; H01L 33/22
See application file for complete search history.

(56) References Cited

U.S. PATENT DOCUMENTS

| | | | |
|---|---|---|---|
| 2013/0155690 A1* | 6/2013 | Chen | F21V 5/04 362/311.02 |
| 2014/0203317 A1* | 7/2014 | Shin | H01L 33/387 257/98 |
| 2014/0301085 A1* | 10/2014 | Hwang | F21K 9/50 362/308 |
| 2015/0204508 A1* | 7/2015 | Kim | F21V 5/04 362/311.06 |
| 2016/0091431 A1* | 3/2016 | Clark | A61K 36/185 436/150 |
| 2016/0099388 A1* | 4/2016 | Jung | H01L 22/24 438/16 |

* cited by examiner

*Primary Examiner* — Ngan Ngo
(74) *Attorney, Agent, or Firm* — Patterson + Sheridan, LLP

(57) ABSTRACT

A semiconductor light-emitting device comprises an epitaxial structure comprising a first semiconductor stack, a second semiconductor stack, and an active layer between the first semiconductor stack and second semiconductor stack for emitting a light; and a main light-extraction surface on the first semiconductor stack, wherein the light passes through the main light-extraction surface. The main light-extraction surface comprises a first light-extraction region, a second light-extraction region, and a maximum near-field luminous intensity. The distribution of the near-field luminous intensity in the first light-extraction region is between 70% and 100% of the maximum near-field luminous intensity, the distribution of the near-field luminous intensity in the second light-extraction region is between 0% and 70% of the maximum near-field luminous intensity. A ratio of an area of the first light-extraction region to an area of the second light-extraction region is between 0.25 and 0.45.

20 Claims, 7 Drawing Sheets

US 9,490,394 B2

SEMICONDUCTOR LIGHT-EMITTING DEVICE

RELATED APPLICATION DATA

This application claims the right of priority of TW Application No. 104101418, filed on Jan. 16, 2015, and the content of which is hereby incorporated by reference in its entirety.

TECHNICAL FIELD

This present application is related to a structure of light-emitting device.

DESCRIPTION OF BACKGROUND ART

FIG. 1 shows a structure of a conventional light-emitting diode 100 comprising a substrate 5b, an epitaxial structure 1b and two electrodes 2, 9b, wherein the epitaxial structure 1b comprises a first semiconductor stack 11b, an active layer 10b and a second semiconductor stack 12b. The electrode 2 is formed on an upper surface of the epitaxial structure 1b for connecting the outer power supply through a metal conductive wire 2b, and the electrode 9b is formed under the substrate 5b. The electrodes 2, 9b are used for conducting an external electrical current flowing through the active layer 10b so that electrical holes and electrons recombine in the active layer 10b to release light with a peak wavelength, which makes the light-emitting diode 100 emit light. When the volume of the light-emitting diode 100 is decreased, the influence of the non-radiative recombination which comes from the lattice dislocations on the side wall of the epitaxial structure caused by etching becomes more obvious, and thus the light-emitting efficiency is decreased.

SUMMARY OF THE DISCLOSURE

A semiconductor light-emitting device comprises an epitaxial structure comprising a first semiconductor stack, a second semiconductor stack, and an active layer between the first semiconductor stack and second semiconductor stack for emitting a light; and a main light-extraction surface on the first semiconductor stack, wherein the light passes through the main light-extraction surface. The main light-extraction surface comprises a first light-extraction region, a second light-extraction region, and a maximum near-field luminous intensity. The near-field luminous intensity in the first light-extraction region is between 70% and 100% of the maximum near-field luminous intensity, and the near-field luminous intensity in the second light-extraction region is between 0% and 70% of the maximum near-field luminous intensity. A ratio of an area of the first light-extraction region to an area of the second light-extraction region is between 0.25 and 0.45.

DETAILED DESCRIPTION OF PREFERRED EMBODIMENTS

First Embodiment

Figure 1:
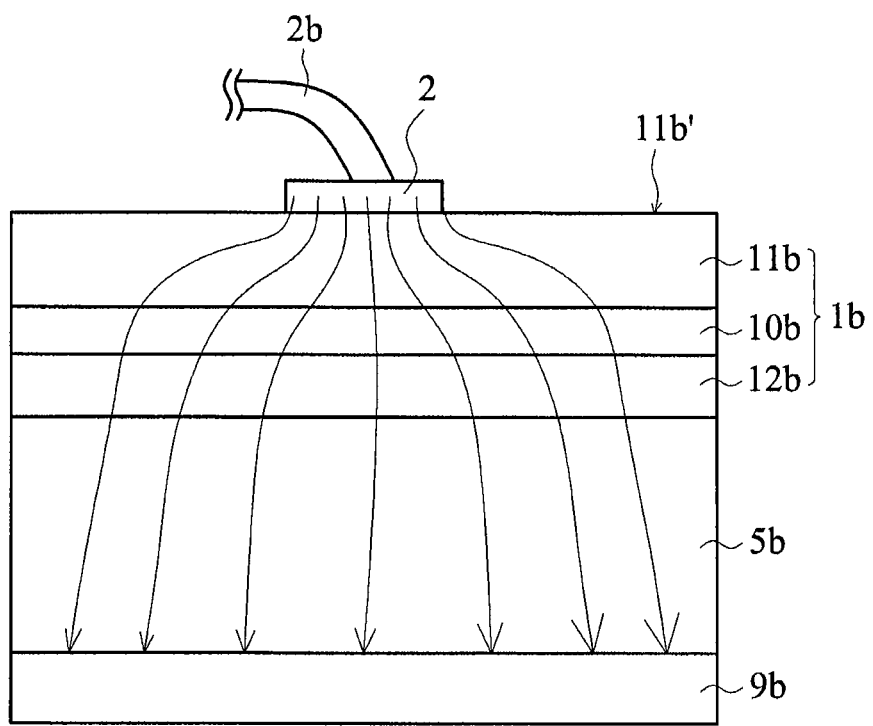
FIG. 1 shows a structure of a conventional light-emitting diode.
Figure 2A:
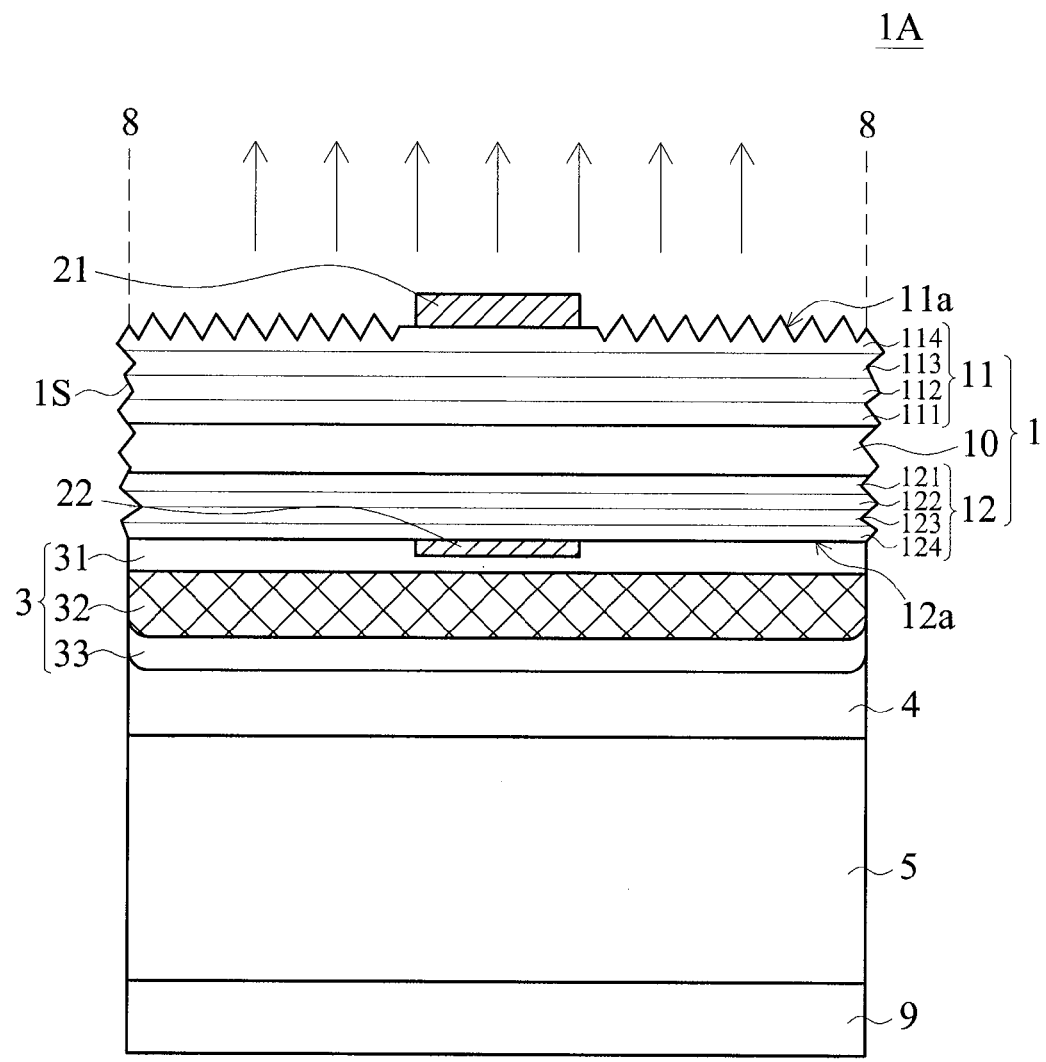
FIGS. 2A and 2B show a light-emitting device 1A disclosed in the first embodiment of the present application.

FIG. 2A shows a light-emitting device 1A in accordance with the first embodiment of the present application. The light-emitting device 1A comprises an epitaxial structure 1, wherein the epitaxial structure 1 comprises a first semiconductor stack 11, an active layer 10 and a second semiconductor stack 12. An upper electrode 21 is on the center position of an upper surface 11a of the first semiconductor stack 11 and ohmically contacts the first semiconductor stack 11, wherein a portion of the upper surface 11a of the first semiconductor stack 11 uncovered by the upper electrode 21 is a rough surface for improving the light extraction efficiency. In the embodiment, the upper surface 11a is the main light-extraction surface, and the epitaxial structure 1 is devoid of a distributed Bragg reflector (DBR) between the active layer 10 and the upper surface 11a. A second ohmic contact structure 22 is on the center position of a lower surface 12a of the second semiconductor stack 12 and ohmically contacts the second semiconductor stack 12; a reflective stack 3 is on the lower surface 12a of the second semiconductor stack 12 for covering the second semiconductor stack 12 and the second ohmic contact structure 22, wherein the reflective stack 3 comprises a transparent conductive layer 31 covering the second semiconductor stack 12 and the second ohmic contact structure 22, a metal reflective layer 32 covering the transparent conductive layer 31, and a barrier layer 33 covering the metal reflective layer 32; a conductive substrate 5 bonded with the reflective stack 3 by an adhesive layer 4; and a back side electrode 9 disposed on a side of the conductive substrate 5 opposite to the reflective stack 3, wherein an electrical current is conducted into the light-emitting device 1A by the upper electrode 21 and the back side electrode 9 so that the active layer 10 emits a light which is able to penetrate the first semiconductor stack 11 and the second semiconductor stack 12. The bandgaps of the first semiconductor stack 11 and the second semiconductor stack 12 are larger than the bandgap of the active layer 10, so the transparencies of the first semiconductor stack 11 and the second semiconductor stack 12 for the light emitted from the active layer 10 are more than 50%. The light is able to penetrate the first semiconductor stack 11 and exit from the upper surface 11a or a side surface 1S of the epitaxial structure 1, or is able to be reflected by the reflective stack 3 and exit from the upper surface 11a or the side surface 1S of the epitaxial structure 1.

The active layer 10 comprises a MQW (Multiple Quantum Wells) structure; the first semiconductor stack 11 comprises a first conductivity confining layer 111, a first conductivity cladding layer 112, a first conductivity window layer 113, and a first conductivity contact layer 114; the second semiconductor stack 12 comprises a second conductivity confining layer 121, a second conductivity cladding layer 122, a second conductivity window layer 123, and a second conductivity contact layer 124. The first conductivity cladding layer 112 and the second conductivity cladding layers 122 respectively provides electrons and holes recombining in the active layer 10 for emitting a light, and both layers have bandgaps larger than the bandgap of the active layer 10. The first conductivity confining layer 111 and the second conductivity confining layer 121 are able to increase the percentage of the electrons and the holes recombining in the active layer 10 and both have bandgaps larger than the bandgap of the active layer 10. The first conductivity window layer 113 and the second conductivity window layer 123 both have smaller sheet resistance than that of both of the cladding layers 112, 122 for improving the electrical current lateral spreading and increasing the light extraction efficiency. The first conductivity contact layer 114 and the second conductivity contact layer 124 ohmically contact the upper electrode 21 and the second ohmic contact structure 22 respectively, wherein the resistance between the first conductivity contact layer 114 and the upper electrode 21 and the resistance between the second conductivity contact layer 124 and the second ohmic contact structure 22 are smaller than $10^{-4}$ Ω-cm. The material of the first semiconductor stack 11, the active layer 10 and the second semiconductor stack 12 comprises III-V semiconductor, such as $Al_xIn_yGa_{(1-x-y)}N$ or $Al_xIn_yGa_{(1-x-y)}P$, 0≤x, y≤1, and can be doped different elements to be with different conductivities. For example, the first conductivity is n-type and the second conductivity is p-type, or the first semiconductor stack 11 is a n-type semiconductor and the second semiconductor stack 12 is p-type semiconductor. The epitaxial structure 1 is able to emit red light with a peak wavelength between 610 nm and 650 nm, green light with a peak wavelength between 530 nm and 570 nm or blue light with a peak wavelength between 440 nm and 490 nm depending on the material of the active layer 10.

Figure 3:
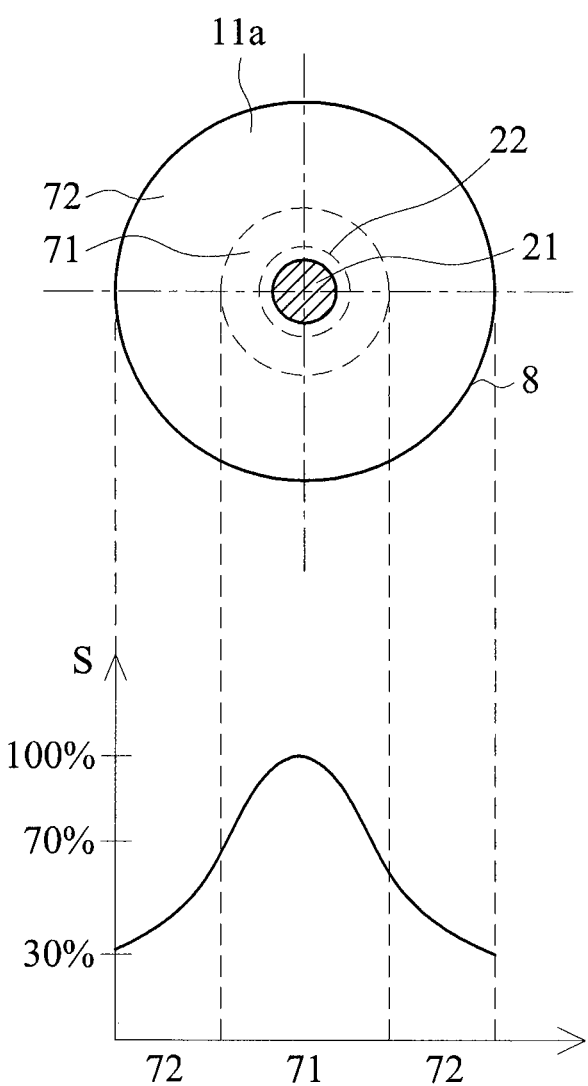
FIG. 3 shows the top-view of the light-emitting device 1A disclosed in the first embodiment of the present application.

FIG. 3 shows the top-view of the light-emitting device 1A in accordance with this embodiment of the present application. The light-emitting device 1A has an edge 8 for defining the shape of the upper surface 11a. In the embodiment, the upper surface 11a is a circle, and in other embodiment, the upper surface 11a comprises a polygon, such as rectangle, inequilateral pentagon and inequilateral hexagon, or a regular polygon, such as square, equilateral pentagon and equilateral hexagon. The upper electrode 21 and the second ohmic contact structure 22 are respectively on the center of the upper surface 11a and the center of the lower surface 12a for decreasing the proportion of the electrical current flowing through the side wall 1S of the epitaxial structure 1. In the embodiment, the area of the upper electrode 21 is 1%-10% of the area of the upper surface 11a of the first semiconductor stack 11 and the area of the second ohmic contact structure 22 is 1%-10% of the area of the lower surface 12a of the second semiconductor stack 12 for preventing the upper electrode 21 and the second ohmic contact structure 22 from shielding too much light as the area of the upper electrode 21 and the area of the second ohmic contact structure 22 being too large, and for preventing the forward threshold voltage from being too high that might decrease the light-emitting efficiency as the area of the upper electrode 21 becomes too small. As the area of the upper electrode 21 is about 2% of the area of the upper surface 11a and the area of the second ohmic contact structure 22 is about 2% of the area of the lower surface 12a, the light-emitting efficiency is the highest.

In the embodiment, the area of the upper surface 11a of the light-emitting device 1A is smaller than 10000 μm², or the circumference of the upper surface 11a is smaller than 400 μm. The upper electrode 21 is on the center of the upper surface 11a and the smallest distance between the upper electrode 21 and the edge 8 is smaller than 50 μm. As the thickness of the epitaxial structure 1 is larger than 10 μm and the ratio of the thickness of the epitaxial structure 1 to the circumference of the upper surface 11a is larger than 2.5%, the electrical current easily spreads in the epitaxial structure 1, and the ratio of the electrical current flowing through the side surface 1S of the epitaxial structure 1 of the light-emitting device 1A is increased. Therefore, in the embodiment, the thickness of the epitaxial structure 1 is decreased to be smaller than 3 μm, between 1 μm and 3 μm, or preferably between 1 μm and 2 μm, and the ratio of the thickness of the epitaxial structure 1 to the circumference of the upper surface 11a is smaller than 0.75% for reducing the non-radiative recombination and increasing the light-emitting efficiency. The total thickness of the first semiconductor stack 11 is the thickness of the epitaxial structure between the active layer 10 and the upper surface 11a, and the total thickness of the second semiconductor stack 12 is the thickness of the epitaxial structure between the active layer 10 and the lower surface 12a. In the embodiment, the total thickness of the first semiconductor stack 11 is not larger than 1 μm, or preferably between 1000 Å and 5000 Å, and/or the total thickness of the second semiconductor stack 12 is not larger than 1 μm, or preferably between 1000 Å and 5000 Å, wherein the thickness of each of the first conductivity confining layer 111, the first conductivity cladding layer 112 and the first conductivity window layer 113 of the second semiconductor stack 12 is not larger than 2000 Å, or preferably between 500 Å and 1500 Å; the thickness of each of the second conductivity confining layer 121, the second conductivity cladding layers 122, and the second conductivity window layer 123 is not larger than 2000 Å, or preferably between 500 Å and 1500 Å. The thickness of each of the first conductivity contact layer 114 and the second conductivity contact layer 124 is not larger than 2000 Å, or preferably between 500 Å and 1500 Å. Since the total thickness of the first semiconductor stack 11 is between 1000 Å and 5000 Å, the upper surface 11a of the first semiconductor stack 11 is roughened by wet etching or dry etching method. In order to precisely control the etching depth, the upper surface 11a of the first semiconductor stack 11 can be etched by ICP (Inductively Coupled Plasma) for preventing the first semiconductor stack 11 from being penetrated to form current leakage paths due to poor control of the etching depth. On the roughened upper surface 11a of the first semiconductor stack 11, the distance between a high point and a neighboring low point in vertical direction is between 500 Å and 3000 Å.

In the embodiment, the shape of the upper surface 11a of the light-emitting device 1A is preferably a circle, and the side surface 1S of the epitaxial structure 1 is formed by ICP, so the side surface 1S is a rough or an uneven surface, the portion of the electrical current flowing through the side surface 1S is increased, the non-radiative recombination is increased, and the light-emitting efficiency is decreased. In order to decrease the area of the side surface 1S of the epitaxial structure 1 for reducing the non-radiative recombination thereon, the shape of the upper surface 11a is a circle. When the area of the upper surface 11a of the light-emitting device 1A is 10000 μm², the circumference of the upper surface 11a is about 354 μm as the shape of the upper surface 11a is a circle, which is smaller than 400 μm of the circumference of the upper surface 11a as the shape of the upper surface 11a is a square. As the circumference is smaller, the area of the side surface 1S of the epitaxial structure 1 is smaller. As the shape of the upper surface 11a is a circle, the distance between each of points of the edge 8 and the upper electrode 21 on the center thereof is the same for limiting the electrical current flowing paths in the interior of the epitaxial structure 1.

FIG. 3 shows the upper surface 11a of the light-emitting device 1A comprising a first light-extraction region 71 and a second light-extraction region 72, wherein the first light-extraction region 71 is on the center of the upper surface 11a, and the second light-extraction region 72 is between the first light-extraction region 71 and the edge 8. When the light-emitting device 1A is applied to a pixel of a display and driven by a smaller electrical current density, such as an electrical current density between 0.1 A/cm$^2$ and 1 A/cm$^2$, the upper surface 11a has a near-field luminous intensity distribution S, wherein the maximum near-field luminous intensity is in the first light-extraction region 71, the near-field luminous intensity in the first light-extraction region 71 is larger than 70% of the maximum near-field luminous intensity, and the near-field luminous intensity in the second light-extraction region 72 is between 30% and 70% of the maximum near-field luminous intensity. In the embodiment, the total of the thickness of the epitaxial structure 1 is significantly reduced so the distance of the electrical current flowing through the epitaxial structure 1 in vertical direction is decreased, and the electrical current is able to be limited in the interior of the epitaxial structure 1 with difficulty to diffuse to the side of the epitaxial structure 1. The upper electrode 21 and the second ohmic contact structure 22 are respectively on the center of the upper surface 11a and the center of the lower surface 12a so the portion of the electrical current flowing to the side surface 1S of the epitaxial structure 1 is decreased so the loss of the light emitting efficiency caused by the non-radiative recombination is reduced. The shape of the first light-extraction region 71 is a circle, which is similar to the shape of the upper surface 11a, and the area ratio of the first light-extraction region 71 to the second light-extraction region 72 is between 0.25 and 0.45.

Figure 2B:
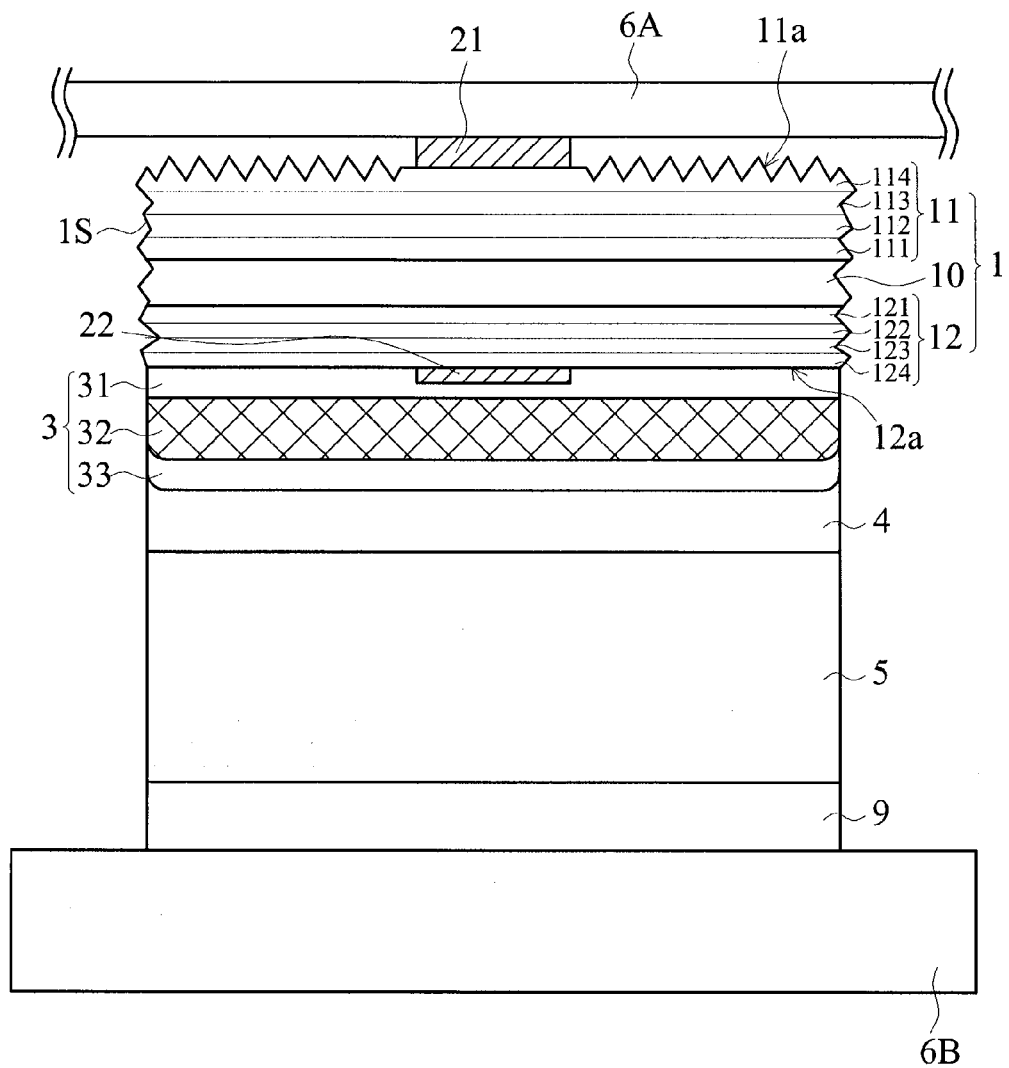

In the embodiment, the area of the upper surface 11a of the light-emitting device 1A is smaller than 10000 μm$^2$. When the shape of the upper surface 11a is square, the circumference of the upper surface 11a is smaller than 400 μm. When the shape of the upper surface 11a is circle, the circumference of the upper surface 11a is smaller than 354 μm. When the upper electrode 21 is connected to a metal line with a width between 5 μm and 10 μm on the upper surface 11a for conducting an external electrical current, the portion of area of the upper surface 11a shielded by the metal line is over 2.5% of the area of the upper surface 11a so the light-extraction area is decreased. Thus, as shown in FIG. 2B, the light-emitting device 1A is able to be bonded to a circuit of a sub-mount 6B, such as lead frame, for forming an electrical connection, and an external transparent electrode 6A is provided to connect the upper electrode 21 of the light-emitting device 1A for conducting the external electrical current, wherein the material of the transparent electrode 6A comprises conductive oxide, such as IZO, IGZO, ZnO and AZO. In other embodiment, multiple light-emitting devices 1A are electrically connected to the circuit of the sub-mount 6B, and the transparent electrode 6A connects the upper electrodes 21 of the multiple light-emitting devices 1A to form a parallel, series or series-parallel circuit. In the embodiment, the first semiconductor stack 11 is n-type semiconductor, and the transparent electrode 6A ohmically contacts the upper electrode 21. The material of the upper electrode 21 comprises metal, such as Ge, Au, Ni, Ge—Au alloy and Ge—Au—Ni alloy. The second ohmic contact structure 22 is on the center position of the lower surface 12a opposite to the upper surface 11a and ohmically contacts the second semiconductor stack 12, wherein the concentration of the doped material of the second conductivity contact layer 124 of the second semiconductor stack 12 is about 1*10$^{19}$/cm$^3$. The second ohmic contact structure 22 can be made of metal oxide, such as ITO, for ohmically contacting the second semiconductor stack 12 and increasing the light extraction efficiency from the lower surface 12a of the second semiconductor stack 12. The material of the transparent conductive layer 31 on the second ohmic contact structure 22 comprises IZO, IGZO, ZnO, or AZO. The material of the metal reflective layer 32 on the transparent conductive layer 31 comprises the metal having the reflective index larger than 95% to the light emitted from the active layer 10, such as Ag, Al and Au. The transparent conductive layer 31 is able to separate the metal reflective layer 32 and the second semiconductor stack 12 to prevent physical or chemical reaction from occurring between the metal reflective layer 32 and the second semiconductor stack 12 that might decrease the reflective index or electrical conductivity of the metal reflective layer 32 as the light-emitting device 1A is driven by an electrical current for a long period. Besides, the transparent conductive layer 31 is able to laterally spread the electrical current in the reflective stack 3 to prevent the heat from concentrating in a portion of the reflective stack 3. The refractive index of the transparent conductive layer 31 is 1.0 smaller than the refractive index of the second semiconductor stack 12 so the total reflection interface caused by the difference of the refractive indices therebetween is able to reflect a portion of the light emitted from the active layer 10, and the rest of the light, which is not reflected, penetrates the transparent conductive layer 31 and is reflected by the metal reflective layer 32. The material of the barrier layer 33 covering the metal reflective layer 32 comprises Ti, Pt, Au, W, Cr or the alloy thereof for separating the metal reflective layer 32 and the adhesive layer 4 for maintaining the stability of the metal reflective layer 32 and for preventing physical or chemical reaction from occurring between the metal reflective layer 32 and the adhesive layer 4 that decreases the reflective index or electrical conductivity thereof. The adhesive layer 4 is used for bonding the conductive substrate 5 and the reflective stack 3 so the electrical current is able to flow therebetween. The material of adhesive layer 4 comprises In, Ti, Ni, Sn, Au, the stack thereof or the alloy thereof. The material of conductive substrate 5 comprises Si, GaAs, CuW, Cu or Mo. The back side electrode 9 disposed on a side of the conductive substrate 5 opposite to the reflective stack 3 comprises Au for conducting the external electrical current. In the embodiment, when the external electrical current is conducted to the light-emitting device 1A, an electrical current density passing through the epitaxial structure 1 is between 0.1 A/cm$^2$ and 1 A/cm$^2$.

Second Embodiment

Figure 4A:
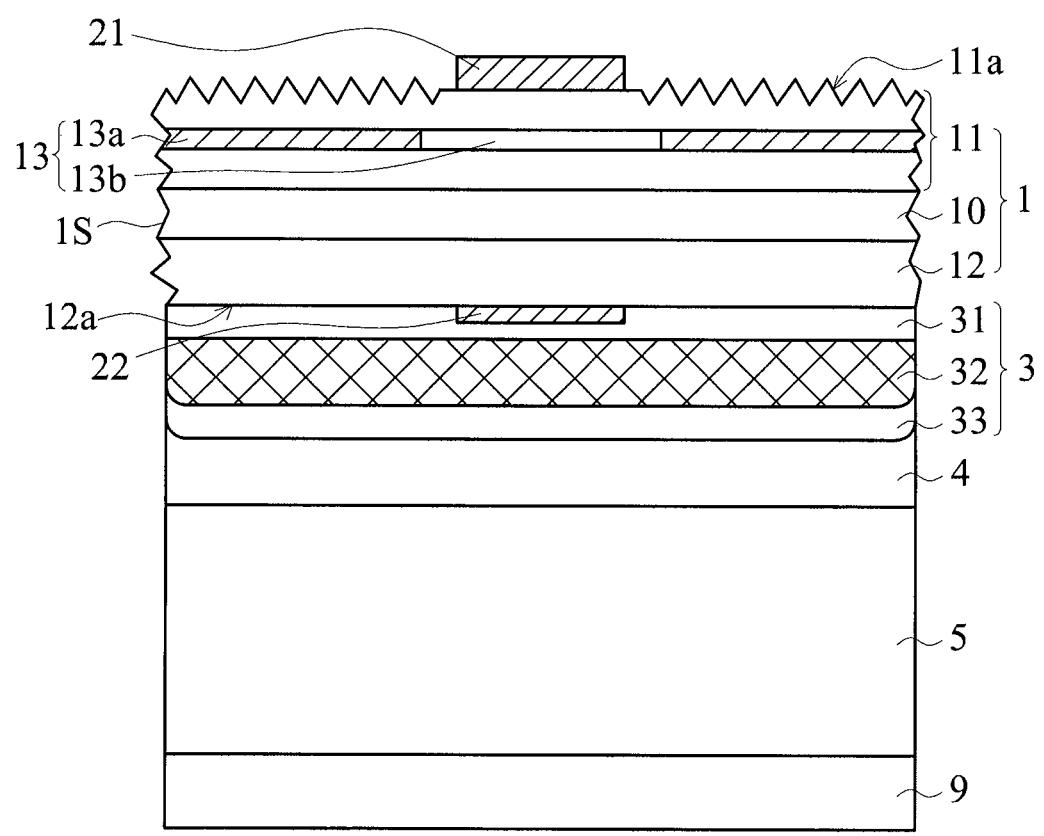
FIGS. 4A and 4B show a light-emitting device 1B and a light-emitting device 1C disclosed in the second embodiment of the present application.
Figure 4B:
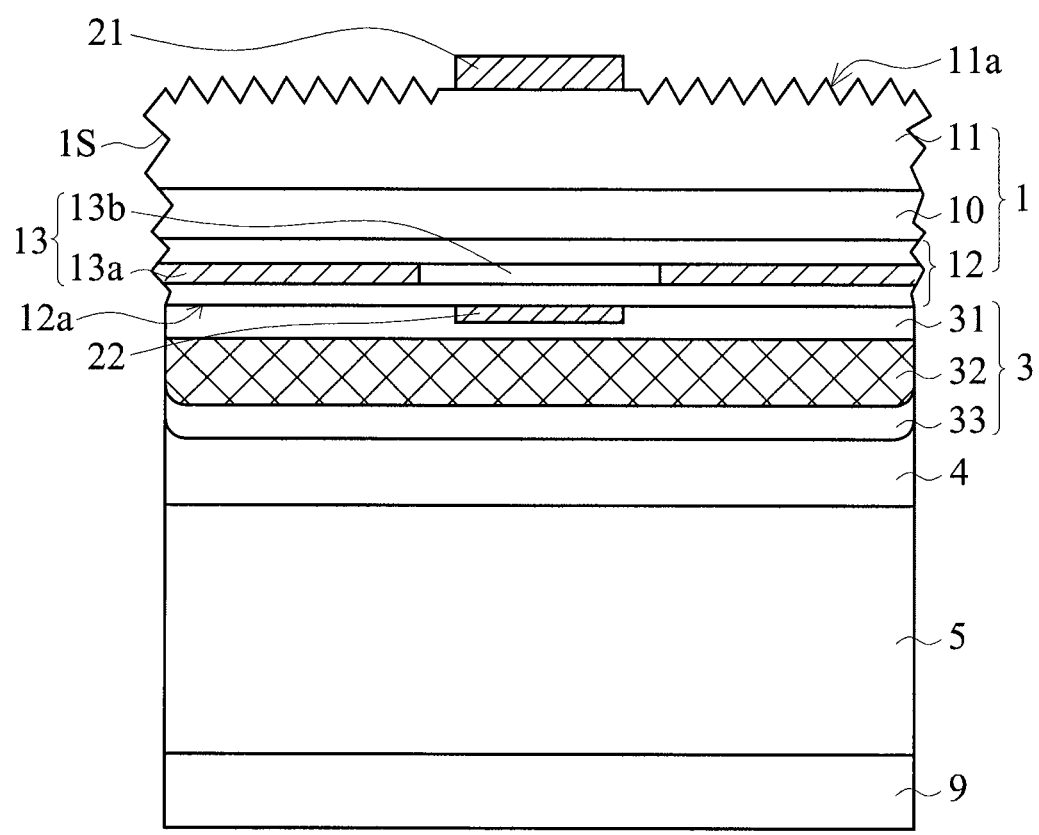

FIGS. 4A and 4B show a light-emitting device 1B and a light-emitting device 1C in accordance with the second embodiment of the present application. The difference between the second embodiment and the first embodiment is that the epitaxial structure 1 comprises a control layer 13, wherein the control layer 13 is in the first semiconductor stack 11 as FIG. 4A shows the light-emitting device 1B, or the control layer 13 is in the second semiconductor stack 12 as FIG. 4B shows the light-emitting device 1C. The control layer 13 comprises a conductive region 13b and an oxide region 13a, wherein the oxide region 13a surrounds the conductive region 13b and exposes on the side surface 1S of the epitaxial structure 1. The material of the conductive region 13b comprises conductive material, such as (Al$_x$Ga$_{1-x}$)As, 0.9<x≤1. The material of the oxide region 13a comprises electrically-insulative material, such as Al$_y$O, 0<y<1.

Figure 4C:
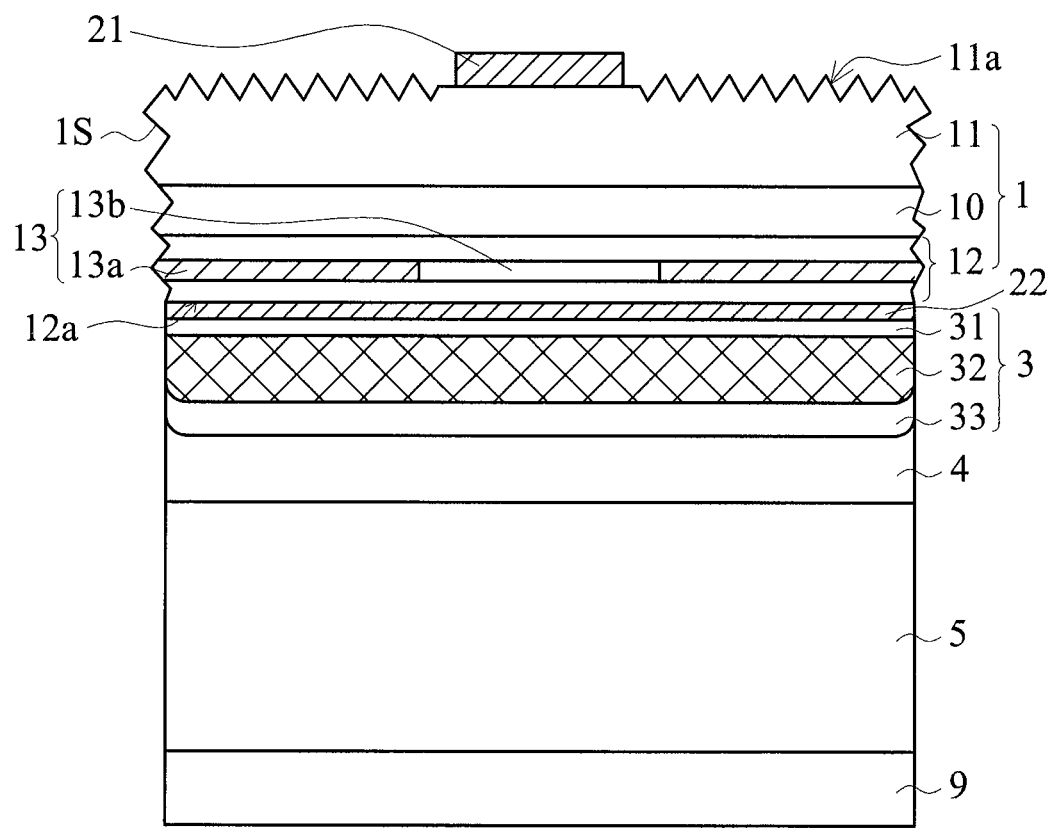
FIG. 4C shows a light-emitting device 1D disclosed in one embodiment of the present application.

The conductive region 13b, the upper electrode 21, and the second ohmic contact structure 22 are overlapped in the vertical direction to limit the electrical current to be distributed in a portion of the epitaxial structure 1. FIG. 4C shows a light-emitting device 1D in accordance with one embodiment of the present embodiment. The second ohmic contact structure 22 covers the lower surface 12a of the second semiconductor stack 12. The transparent conductive layer 31 covers the second ohmic contact structure 22, wherein the transparent conductive layer 31 is able to laterally distribute electrical current and to bind the second ohmic contact structure 22 with the metal reflective layer 32. In the embodiment, the materials of the second ohmic contact structure 22, the transparent conductive layer 31, and the metal reflective layer 32 are the same as the materials mentioned in the first embodiment.

Although the present application has been explained above, it is not the limitation of the range, the sequence in practice, the material in practice, or the method in practice. Any modification or decoration for present application is not detached from the spirit and the range of such.

What is claimed is:

1. A semiconductor light-emitting device comprising:
    an epitaxial structure comprising a first semiconductor stack, a second semiconductor stack, and an active layer between the first semiconductor stack and the second semiconductor stack for emitting a light; and
    a main light-extraction surface on the first semiconductor stack, wherein the light passes through the main light-extraction surface, wherein the main light-extraction surface comprises a first light-extraction region, a second light-extraction region and a maximum near-field luminous intensity,
    wherein the near-field luminous intensity distributing in the first light-extraction region is between 70% and 100% of the maximum near-field luminous intensity, the near-field luminous intensity distributing in the second light-extraction region is between 0% and 70% of the maximum near-field luminous intensity, and a ratio of an area of the first light-extraction region to an area of the second light-extraction region is between 0.25 and 0.45.

2. The semiconductor light-emitting device according to claim 1, wherein an area of the first semiconductor stack is the same as an area of the second semiconductor stack.

3. The semiconductor light-emitting device according to claim 1, wherein the main light-extraction surface further comprises an edge, and the second light-extraction region is between the first light-extraction region and the edge.

4. The semiconductor light-emitting device according to claim 3, wherein the main light-extraction surface has a circumference, the epitaxial structure has a thickness, and a ratio of the thickness to the circumference is larger than 1%.

5. The semiconductor light-emitting device according to claim 1, wherein a shape of the first light-extraction region is the same as a shape of the main light-extraction surface.

6. The semiconductor light-emitting device according to claim 1, wherein a shape of the main light-extraction surface comprises a circle or a regular polygon.

7. The semiconductor light-emitting device according to claim 1, further comprising an upper electrode on the first semiconductor stack and a second ohmic contact structure on the second semiconductor stack.

8. The semiconductor light-emitting device according to claim 7, wherein the upper electrode, the second ohmic contact structure, and a center point of the main light-extraction surface are overlapped in a vertical direction.

9. The semiconductor light-emitting device according to claim 7, wherein an area of the upper electrode is between 1% and 10% of an area of the main light-extraction surface, and an area of the second ohmic contact structure is between 1% and 10% of the area of the main light-extraction surface.

10. The semiconductor light-emitting device according to claim 7, wherein a material of the upper electrode comprises Ge, Au, Ni, or the combination thereof.

11. The semiconductor light-emitting device according to claim 7, wherein a material of the second ohmic contact structure comprises transparent conductive material.

12. The semiconductor light-emitting device according to claim 7, further comprising a reflective stack covering the second ohmic contact structure and the second semiconductor stack.

13. The semiconductor light-emitting device according to claim 12, further comprising a conductive substrate and an adhesive layer between the reflective stack and the conductive substrate.

14. The semiconductor light-emitting device according to claim 1, wherein a thickness of the first semiconductor stack and a thickness of the second semiconductor stack both are smaller than 500 nm.

15. The semiconductor light-emitting device according to claim 1, wherein a thickness of the epitaxial structure is smaller than 3 μm.

16. The semiconductor light-emitting device according to claim 1, wherein the epitaxial structure is devoid of distributed Bragg reflector (DBR) between the active layer and the main light-extraction surface.

17. The semiconductor light-emitting device according to claim 1, wherein the epitaxial structure further comprises a control layer, wherein the control layer comprises a conductive region and an oxide region surrounding the conductive region.

18. The semiconductor light-emitting device according to claim 17, wherein the conductive region and the first light-extraction region are overlapped in a vertical direction.

19. The semiconductor light-emitting device according to claim 17, wherein the conductive region comprises $(Al_xGa_{1-x})As$, $0.9 < x \leq 1$.

20. The semiconductor light-emitting device according to claim 1, wherein an area of the main light-extraction surface is smaller than $10^4$ μm$^2$.

* * * * *